United States Patent
Xin

(10) Patent No.: US 11,374,078 B2
(45) Date of Patent: Jun. 28, 2022

(54) ARRAY SUBSTRATE, DISPLAY PANEL, AND DISPLAY DEVICE WITH PIXEL ARRANGEMENT

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventor: Yu Xin, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 58 days.

(21) Appl. No.: 16/909,317

(22) Filed: Jun. 23, 2020

(65) Prior Publication Data
US 2021/0167152 A1   Jun. 3, 2021

(30) Foreign Application Priority Data
Nov. 29, 2019   (CN) .......................... 201911205621.2

(51) Int. Cl.
*H01L 29/08*   (2006.01)
*H01L 27/32*   (2006.01)

(52) U.S. Cl.
CPC ...... *H01L 27/3262* (2013.01); *H01L 27/3218* (2013.01); *H01L 27/3234* (2013.01); *H01L 27/3265* (2013.01); *H01L 27/3276* (2013.01)

(58) Field of Classification Search
CPC ............. H01L 27/3262; H01L 27/3218; H01L 27/3234; H01L 27/3276

USPC ........................................................... 257/40
See application file for complete search history.

(56) References Cited

U.S. PATENT DOCUMENTS

| 2014/0292622 | A1* | 10/2014 | Lee ..................... H01L 27/3262 345/80 |
| 2015/0348481 | A1* | 12/2015 | Hong ................... G09G 3/3685 345/690 |
| 2020/0194512 | A1* | 6/2020 | Wang .................. H01L 27/3216 |

FOREIGN PATENT DOCUMENTS

| CN | 205355055 U | 6/2016 |
| CN | 107464831 A | 12/2017 |
| CN | 110491927 A | 11/2019 |

\* cited by examiner

*Primary Examiner* — Phuc T Dang
(74) *Attorney, Agent, or Firm* — Anova Law Group, PLLC

(57) ABSTRACT

An array substrate, a display panel and a display device are provided. The array substrate includes a plurality of pixel groups arranged as a matrix. The plurality of pixel groups include a plurality of first pixel groups, a plurality of second pixel groups and a plurality of third pixel groups. In odd number rows of pixel groups and odd number columns of pixel groups, the first pixel groups and the second pixel groups are alternately arranged. In even number rows of pixel groups and even number columns of pixel groups, the second pixel groups and the third pixel groups are alternately arranged. Each first pixel group includes two first sub-pixels arranged along a first direction. Each second pixel group includes two second sub-pixels arranged along a second direction; and each third pixel group includes two third sub-pixel groups arranged along the first direction.

20 Claims, 9 Drawing Sheets

ARRAY SUBSTRATE, DISPLAY PANEL, AND DISPLAY DEVICE WITH PIXEL ARRANGEMENT

CROSS-REFERENCES TO RELATED APPLICATIONS

This application claims priority of Chinese Patent Application No. 201911205621.2, filed on Nov. 29, 2019, the entire contents of which are hereby incorporated by reference.

FIELD OF THE DISCLOSURE

The present disclosure generally relates to the field of display technology and, more particularly, relates to an array substrate, a display panel and, and a display device.

BACKGROUND

Organic light-emitting display panels have the advantages of being able to emit light without using backlight and with low power and high brightness. Thus, they are widely used in various electronic devices and are favored by users.

Organic light-emitting display panels with the diamond-type pixel arrangement and the delta-type pixel arrangement have better display performances compared with other light-emitting display panels. However, the organic light-emitting display panel with the diamond-type pixel arrangement have a lower pixel aperture ratio, and the displayed images of the organic light-emitting display panels with the delta-type pixel arrangement have an obvious aliasing phenomenon.

The disclosed array substrate, display panel and, and display device are directed to solve one or more problems set forth above and other problems in the art.

BRIEF SUMMARY OF THE DISCLOSURE

One aspect of the present disclosure provides an array substrate. The array substrate may include a plurality of pixel groups arranged as a matrix with a row direction referred to as a first direction and a column direction referred to as a second direction. The plurality of pixel groups include a plurality of first pixel groups, a plurality of second pixel groups and a plurality of third pixel groups. In odd number rows of pixel groups and odd number columns of pixel groups, the plurality of first pixel groups and the plurality of second pixel groups are alternately arranged. In even number rows of pixel groups and even number columns of pixel groups, the plurality of second pixel groups and the plurality of third pixel groups are alternately arranged. A first pixel group of the plurality of first pixel groups includes two first sub-pixels arranged along the first direction. A second pixel group of the plurality of second pixel groups includes two second sub-pixels arranged along the second direction. A third pixel group of the plurality of third pixel groups includes two third sub-pixel groups arranged along the first direction.

Another aspect of the present disclosure provides a display panel. The display panel may include an array substrate. The array substrate may include a plurality of pixel groups arranged as a matrix with a row direction referred to as a first direction and a column direction referred to as a second direction. The plurality of pixel groups include a plurality of first pixel groups, a plurality of second pixel groups and a plurality of third pixel groups. In odd number rows of pixel groups and odd number columns of pixel groups, the plu-rality of first pixel groups and the plurality of second pixel groups are alternately arranged. In even number rows of pixel groups and even number columns of pixel groups, the plurality of second pixel groups and the plurality of third pixel groups are alternately arranged. A first pixel group of the plurality of first pixel groups includes two first sub-pixels arranged along the first direction. A second pixel group of the plurality of second pixel groups includes two second sub-pixels arranged along the second direction. A third pixel group of the plurality of third pixel groups includes two third sub-pixel groups arranged along the first direction.

Another aspect of the present disclosure provides a display device. The display device may include a display panel. The display panel may include an array substrate. The array substrate may include a plurality of pixel groups arranged as a matrix with a row direction referred to as a first direction and a column direction referred to as a second direction. The plurality of pixel groups include a plurality of first pixel groups, a plurality of second pixel groups and a plurality of third pixel groups. In odd number rows of pixel groups and odd number columns of pixel groups, the plurality of first pixel groups and the plurality of second pixel groups are alternately arranged. In even number rows of pixel groups and even number columns of pixel groups, the plurality of second pixel groups and the plurality of third pixel groups are alternately arranged. A first pixel group of the plurality of first pixel groups includes two first sub-pixels arranged along the first direction. A second pixel group of the plurality of second pixel groups includes two second sub-pixels arranged along the second direction. A third pixel group of the plurality of second pixel groups includes two third sub-pixel groups arranged along the first direction.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
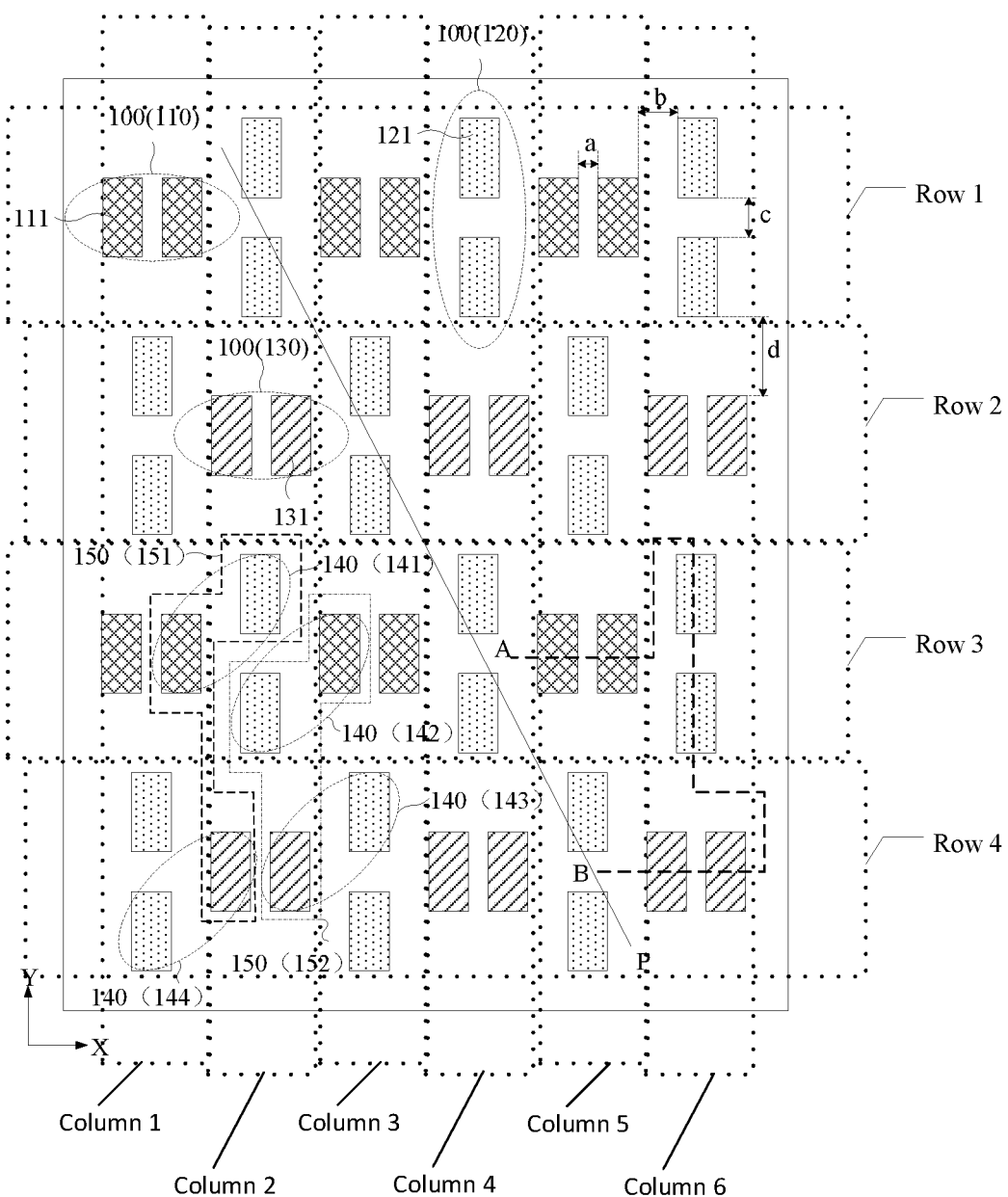
FIG. 1 illustrates an exemplary array substrate consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

The present disclosure provides an array substrate, a display panel and a display device. To explain the technical means and effects adopted by the present disclosure to achieve the intended purpose of the present disclosure, embodiments of an array substrate, a display panel, and a display device according to the present disclosure are described below with reference to the accompanying drawings and exemplary embodiments. The structure, characteristics and effects are described in detail below.

The present disclosure provides an array substrate including a plurality of pixel groups arranged as a matrix. The row direction of the matrix may be referred to as a first direction, and the column direction of the matrix may be referred to as a second direction.

The plurality of pixel groups may include a plurality of first pixel groups, a plurality of second pixel groups, and a plurality of third pixel groups. In the odd number rows of pixel groups and the odd number columns of pixel groups, the first pixel groups and the second pixel groups are alternately arranged. In the even number rows of the pixel groups and the even number columns of pixel groups, the second pixel groups and the third pixel groups are alternately arranged.

Each first pixel group may include two first sub-pixels arranged along the first direction. Each second pixel group may include two second sub-pixels arranged along the second direction. Each third pixel group may include two third sub-pixels arranged along the first direction.

In the technical solution provided by the present disclosure, by setting the first pixel groups and the second pixel groups in the odd number rows of pixel groups and the odd number columns of pixel groups to be alternately arranged, and the second pixel groups and the third pixel groups in the even number rows of pixel groups and the even number columns of pixel groups to be alternately arranged, along the second direction, the second pixel group having a greater length in any row of pixel groups may be disposed to correspond to the first pixel group or the three-pixel group having a smaller length in adjacent rows of pixel groups; and the adjacent rows of pixel groups may be mosaicked. Each of the first pixel groups may include two first sub-pixels arranged along the first direction, each of the second pixel groups may include two second sub-pixels arranged along the second direction, and each of the third pixel groups may include two third sub-pixels arranged along the first direction. Accordingly, the area of other areas outside the opening areas the sub-pixels in the array substrate may be reduced; and the pixel aperture ratio of the display panel may be increased. Further, the sub-pixels of a same color may be arranged along oblique lines, stepped surfaces may not be formed. Thus, the aliasing phenomenon of the displayed image may be reduced; and the display effect of the display panel may be improved.

The above is the core ideas of the present disclosure. The technical solutions in the embodiments of the present disclosure will be clearly and completely described below with reference to the drawings in the embodiments of the present disclosure. Obviously, the described embodiments are only a part of the embodiments of the present disclosure and not all embodiments. Based on the embodiments of the present disclosure, all other embodiments obtained by those of ordinary skill in the art without creative labor shall fall within the protection scope of the present disclosure.

In the following description, many specific details are set forth in order to fully understand the present disclosure, but the present disclosure can also be implemented by other implementations different from those described herein, and those skilled in the art can do so without violating the meaning of the present disclosure. Thus, the present disclosure is not limited by the specific embodiments disclosed below.

Secondly, the present disclosure is described in detail with reference to schematic diagrams. In the detailed description of the embodiments of the present disclosure, for the convenience of explanation, the schematic diagrams showing the structure of the device are not partially enlarged according to general proportions, and the schematic diagrams are merely examples, which should not be limited the scope of the disclosure. In addition, the actual production should include the three-dimensional space dimensions of length, width and height.

FIG. 1 illustrates an exemplary array substrate consistent with various disclosed embodiments of the present disclosure. As shown in FIG. 1, the array substrate may include a plurality of pixel groups 100 arranged as a matrix. The row direction of the matrix may be referred to as a first direction X, and the column direction of the matrix may be referred to as a second direction Y. The plurality of pixel groups 100 may include a plurality of first pixel groups 110, a plurality of second pixel groups 120, and a plurality of third pixel groups 130.

In the odd number rows (e.g. Rows 1 and 3 as shown in FIG. 1) of pixel groups and the odd number columns (e.g.

Columns 1, 3, and 5 as shown in FIG. 1) of pixel groups, the first pixel groups 110 and the second pixel groups 120 may be alternately arranged. In the even number rows (e.g. Rows 2 and 4 as shown in FIG. 1) of pixel groups and the even number columns (e.g. Columns 2, 4, and 6 as shown in FIG. 1) of pixel groups, the second pixel groups 120 and the third pixel groups 130 may be alternately arranged.

A first pixel group of the plurality of first pixel groups 110 may include two first sub-pixels 111 arranged along the first direction X. A second pixel group of the plurality of second pixel groups 120 may include two second sub-pixels 121 arranged along the second direction Y. A third pixel group of the plurality of third pixel groups 130 may include two third sub-pixels 131 arranged along the first direction X.

Along the second direction Y, the length of a second pixel group 120 may be greater than the length of a first pixel group 110 in a same row or the length of a third pixel group 130 in the same row. Further, the adjacent rows of pixel groups may be aligned with offset. The second pixel groups 120 in any row of pixel groups may correspond to the first pixel groups 110 or the third pixel groups 130 in the adjacent rows of pixel groups, and the adjacent rows of pixel groups may be mosaicked together. Thus, the area of the regions outside the openings of the sub-pixels in the array substrate may be reduced. Accordingly, the pixel aperture ratio of the display panel may be improved.

Further, referring to FIG. 1, the pixel groups 100 of the same color may be located on a same oblique line, and the sub-pixels of a same color may be arranged along the oblique line. Thus, a stepped surface may not be formed; and the aliasing phenomenon in the displayed image may be reduced; and the display performance of the display panel may be improved.

Figure 2:
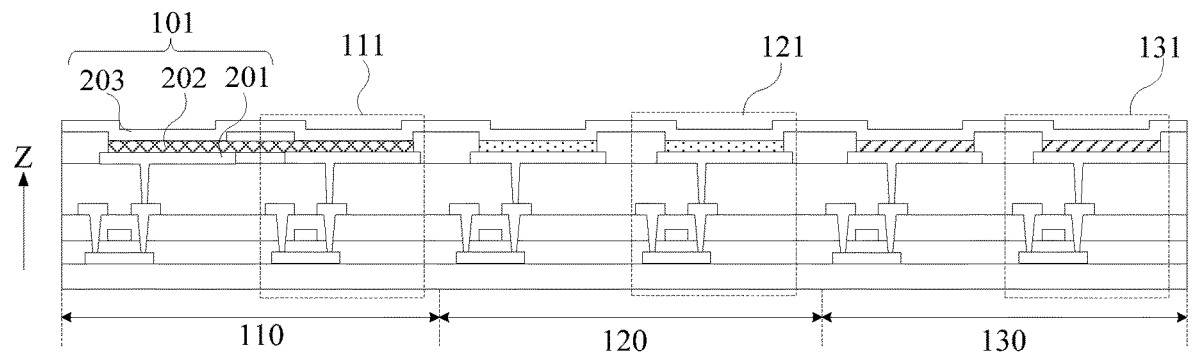
FIG. 2 illustrates an exemplary AB-sectional view in FIG. 1 consistent with various disclosed embodiments of the present disclosure.

FIG. 2 illustrates an exemplary AB-sectional view (i.e., a cross-sectional view of the structure in FIG. 1 along the broken line AB) in FIG. 1 consistent with various disclosed embodiments of the present disclosure. As shown in FIG. 2, the first sub-pixel 111, the second sub-pixel 121, and the third sub-pixel 131 each may include a light-emitting component 101. The light-emitting component 101 may include a first electrode 201, an organic light-emitting functional layer 202, and a second electrode 203 that are sequentially stacked along a light-emitting direction Z.

Further, referring to FIG. 2, the first pixel group 110 may be a reference pixel group. The organic light-emitting functional layers 202 of the two sub-pixels in the reference pixel group may share a same mask opening. In particular, the organic light-emitting functional layers 202 of the two sub-pixels in the reference pixel group may be one whole structure.

The light-emitting principle of the light-emitting component 101 may be as following. After a voltage is applied to the first electrode 201 and the second electrode 203, an electric field may be formed between the first electrode 201 and the second electrode 203. The organic light-emitting functional layer 202 between the two electrodes may emit light under the action of the electric field. The light-emitting area of the sub-pixel may be defined by the relative area of the first electrode 201, the organic light-emitting functional layer 202, and the second electrode 203. Therefore, when the second electrodes 203 of all the sub-pixels are connected as a whole structure, and two sub-pixels share the same light-emitting functional layer 202, the light-emitting area of each sub-pixel may be defined by the first electrode 202 and independent sub-pixels may be obtained. Based on the above analysis, in one embodiment, the organic light-emitting functional layers 202 of the two sub-pixels in the reference pixel group may be set to share the same mask opening such that the distance between the two sub-pixels may no longer be limited by the limit size of the bridge width of the mask. Thus, it may facilitate to reduce the distance between the two sub-pixels, and the aperture ratio of the display panel may be increased.

Further, in the pixel array provided in the embodiment, the adjacent rows of pixel groups may be arranged with an offset, and the distance between any adjacent pixel groups with a same color may be substantially large. After the two first sub-pixels 111 in the first pixel group 110 share a same mask opening, each opening of the mask may correspond to a first pixel group 110. The distance between any adjacent openings may be substantially large. Thus, the difficulty for forming the mask may be reduced.

For illustrative purposes, in one embodiment, the first pixel group 110 may be used as a reference pixel group. In some embodiments, the reference pixel group may also be one or more other pixel groups 100.

Figure 3:
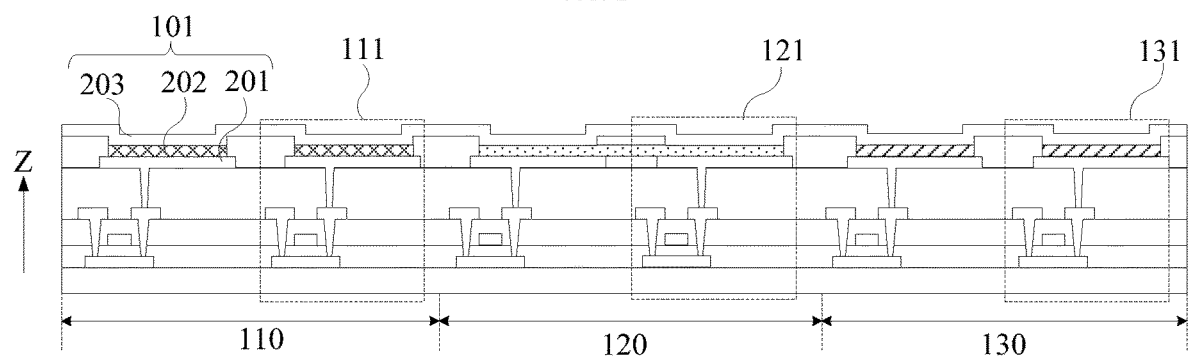
FIG. 3 illustrates another exemplary AB-sectional view in FIG. 1 consistent with various disclosed embodiments of the present disclosure.

FIG. 3 illustrates another exemplary AB-sectional view in FIG. 1 consistent with disclosed embodiments of the present disclosure. As shown in FIG. 3, the second pixel group 120 may be a reference pixel group. The organic light-emitting functional layers 202 of two sub-pixels in the reference pixel group may share a same mask opening. In particular, the organic light-emitting functional layers 202 of the two sub-pixels in the reference pixel group may be one whole structure.

Figure 4:
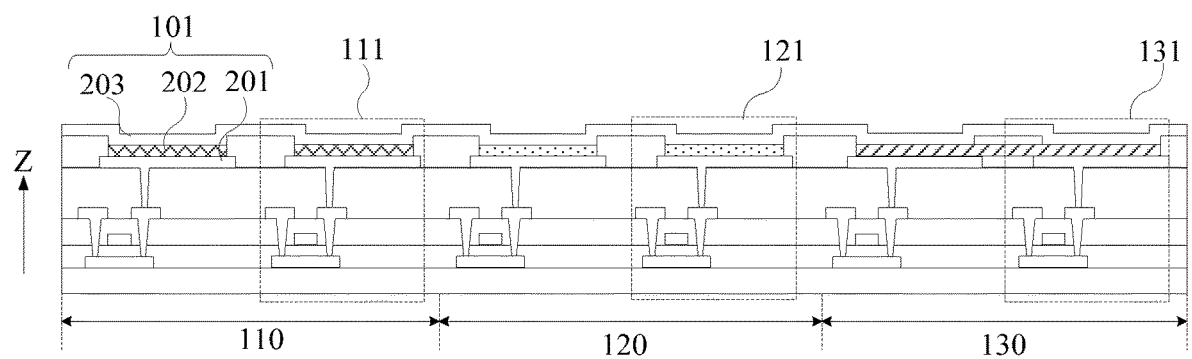
FIG. 4 illustrates another exemplary AB-sectional view in FIG. 1 consistent with various disclosed embodiments of the present disclosure.

FIG. 4 illustrates another exemplary AB-sectional view in FIG. 1 consistent with various disclosed embodiments of the present disclosure. As shown in FIG. 4, the third pixel group 130 may be a reference pixel group. The organic light-emitting functional layers 202 of two sub-pixels in the reference pixel group may share a same mask opening. In particular, the organic light-emitting functional layers 202 of two sub-pixels in the reference pixel group may be one whole structure.

Figure 5:
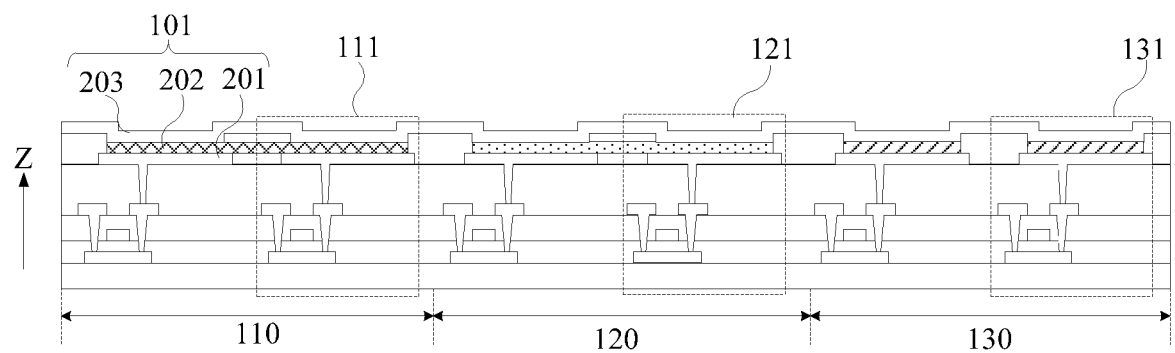
FIG. 5 illustrates another exemplary AB-sectional view in FIG. 1 consistent with various disclosed embodiments of the present disclosure.

FIG. 5 illustrates another exemplary AB-sectional view in FIG. 1 consistent with various disclosed embodiments of the present disclosure. As shown in FIG. 5, the first pixel group 110 and the second pixel group 120 may both be reference pixel groups. The organic light-emitting function layers 202 of two sub-pixels in each reference pixel group may share a same mask opening. In particular, the organic light-emitting functional layers 202 of two sub-pixels in each reference pixel group may be one whole structure.

Figure 6:
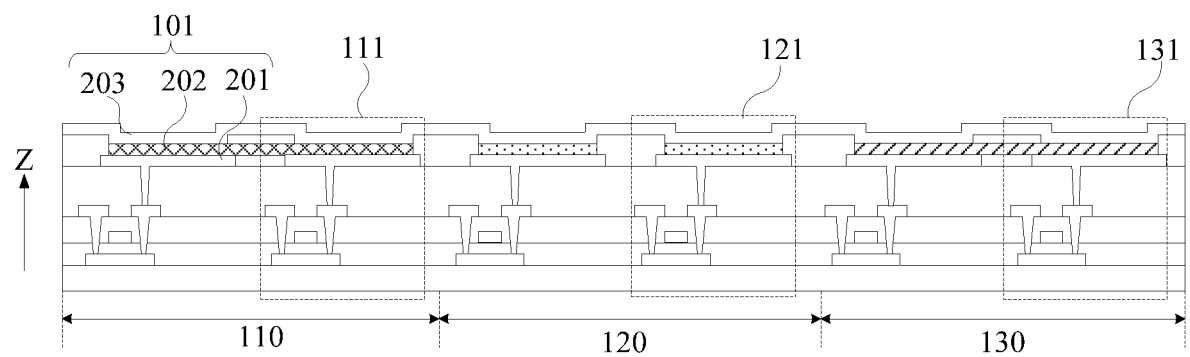
FIG. 6 illustrates another exemplary AB-sectional view in FIG. 1 consistent with various disclosed embodiments of the present disclosure.

FIG. 6 illustrates another exemplary AB-sectional view in FIG. 1 consistent with various disclosed embodiments of the present disclosure. As shown in FIG. 6, the first pixel group 110 and the third pixel group 130 may both be reference pixel groups. The organic light-emitting functional layers 202 of two sub-pixels in each reference pixel group may share a same mask opening. In particular, the organic light-emitting functional layers 202 of two sub-pixels in each reference pixel group may be one whole structure.

Figure 7:
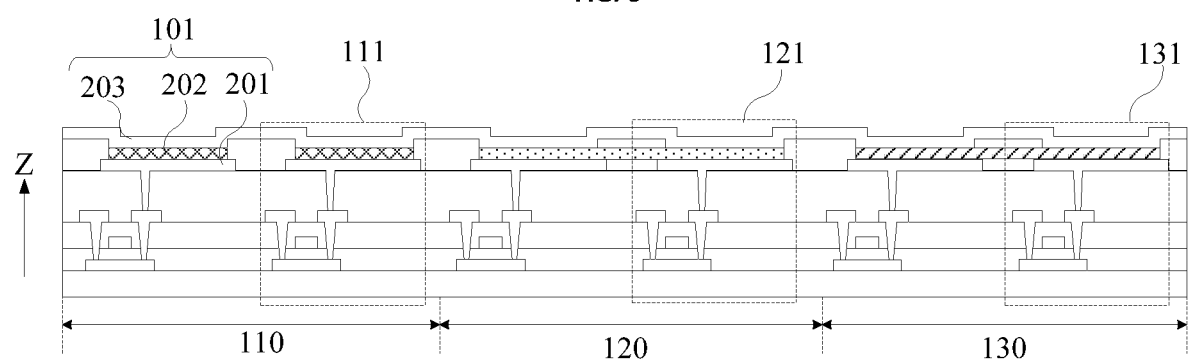
FIG. 7 illustrates another exemplary AB-sectional view in FIG. 1 consistent with various disclosed embodiments of the present disclosure.

FIG. 7 illustrates another exemplary AB-sectional view in FIG. 1 consistent with various disclosed embodiments of the present disclosure. As shown in FIG. 7, the second pixel group 120 and the third pixel group 130 may both be reference pixel groups. The organic light-emitting functional layers 202 of the two sub-pixels in each reference pixel group may share a same mask opening. In particular, the organic light-emitting functional layer 202 of the two sub-pixels in each reference pixel group may be one whole structure.

Figure 8:
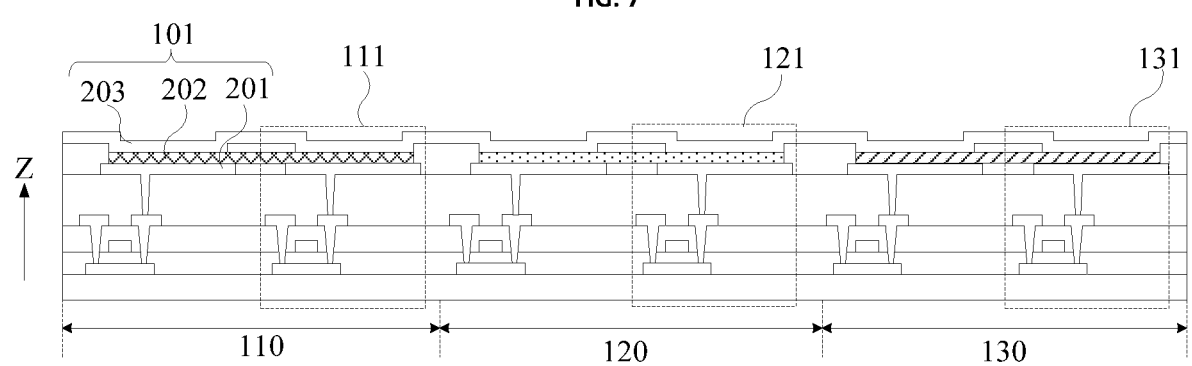
FIG. 8 illustrates another exemplary AB-sectional view in FIG. 1 consistent with various disclosed embodiments of the present disclosure.

FIG. 8 illustrates another exemplary AB-sectional view in FIG. 1 consistent with various disclosed embodiments of the present disclosure. As shown in FIG. 8, the first pixel group 110, the second pixel group 120, and the third pixel group 130 may all be reference pixel groups. The organic light-emitting functional layers 202 of two sub-pixels in each reference pixel group may share a same mask opening. In particular, the organic light-emitting function layers 202 of the two sub-pixels in each reference pixel group may be one whole structure.

Further, referring to FIG. 1, along the first direction X, the distance between two sub-pixels in the same pixel group 100 may be referred to as "a", and the distance between adjacent pixel groups 100 may be referred to as "b", and a<b. Along the second direction Y, the distance between two sub-pixels in a same pixel group 100 may be referred to as "c", and the distance between adjacent pixel groups 100 may be referred to as "d", and c<d.

In above embodiments, the distance between two sub-pixels in the same pixel group 100 may be small. Such a configuration may facilitate to increase the pixel aperture ratio of the display panel. On the other hand, along the first direction X and the second direction Y, the distance between two adjacently arranged sub-pixels with different colors may be relatively large. Thus, the edge mixing of the organic light-emitting functional layers of the two sub-pixels may be avoided, and the occurrence of color mixing issue may be avoided. Accordingly, the display effect of the display panel may be improved.

The values of "a" and "c" each may be in a range of approximately 8 μm to 13 μm, and the values of "b" and "d" each may be in a range of approximately 14 μm-28 μm.

If the values of "a" and "c" are too large, the pixel aperture ratio of the display panel may be reduced. If the values of "a" and "c" are too small, the two sub-pixels in the same pixel group 100 may not be effectively distinguished, the visual resolution of the display panel may be decreased. If the values of "b" and "d" are too large, the pixel aperture ratio and the pixel density of the display panel may be reduced. If the value of "b" and "d" are too small, the mixing possibility the edges of the organic light-emitting functional layers of two adjacent sub-pixels with different colors may be increased. Correspondingly, the display performance of the display panel may be reduced. The experiment results may prove that when the values of "a" and "c" are in the range of 8 um-13 um, and the values of "b" and "d" are in the range of 14 μm-28 μm, the two sub-pixels in the same pixel group 100 may be effectively distinguished, and the display panel may have a higher visual resolution, and a larger pixel aperture ratio and pixel density. Further, the edges of the adjacent organic light-emitting functional layers of two sub-pixels with different colors may have less chance of mixing.

Further, referring to FIG. 1, the pixel group at the n-th row and the m-th column and the pixel group at the (n+1)-th row and the (m+1)-th column may be located on the same straight line. The acute angle between the straight line and the first direction X may range from 30°-70°. "n" may traverse all the positive integers that is less than the total number of rows of the matrix, and "m" may traverse all the positive integers that is less than the total number of columns of the matrix.

In particular, that the pixel group in the n-th row and the m-th column and the pixel group in the (n+1)-th row and the (m+1)-th column may be located on the same straight line may indicate that the geometric center of the pixel group at the n-th row and the m-th column and the geometric center of the pixel group at the (n+1)-th row and the (m+1)-th column may be located on the same straight line. For example, as shown in FIG. 1, the geometric centers of the second pixel group 120 at the first row and the second column, the second pixel group 120 at the second row and the third column, the second pixel group 120 at the third row and the fourth column, and the second pixel group 120 at the fourth row and the fifth column may all be located on the straight line P.

Such a configuration of pixel groups may make the display screen of the display panel have a good oblique linearity, the problem of oblique lines of the display screen may be avoided. Thus, the display effect of the display panel may be improved.

Figure 9:
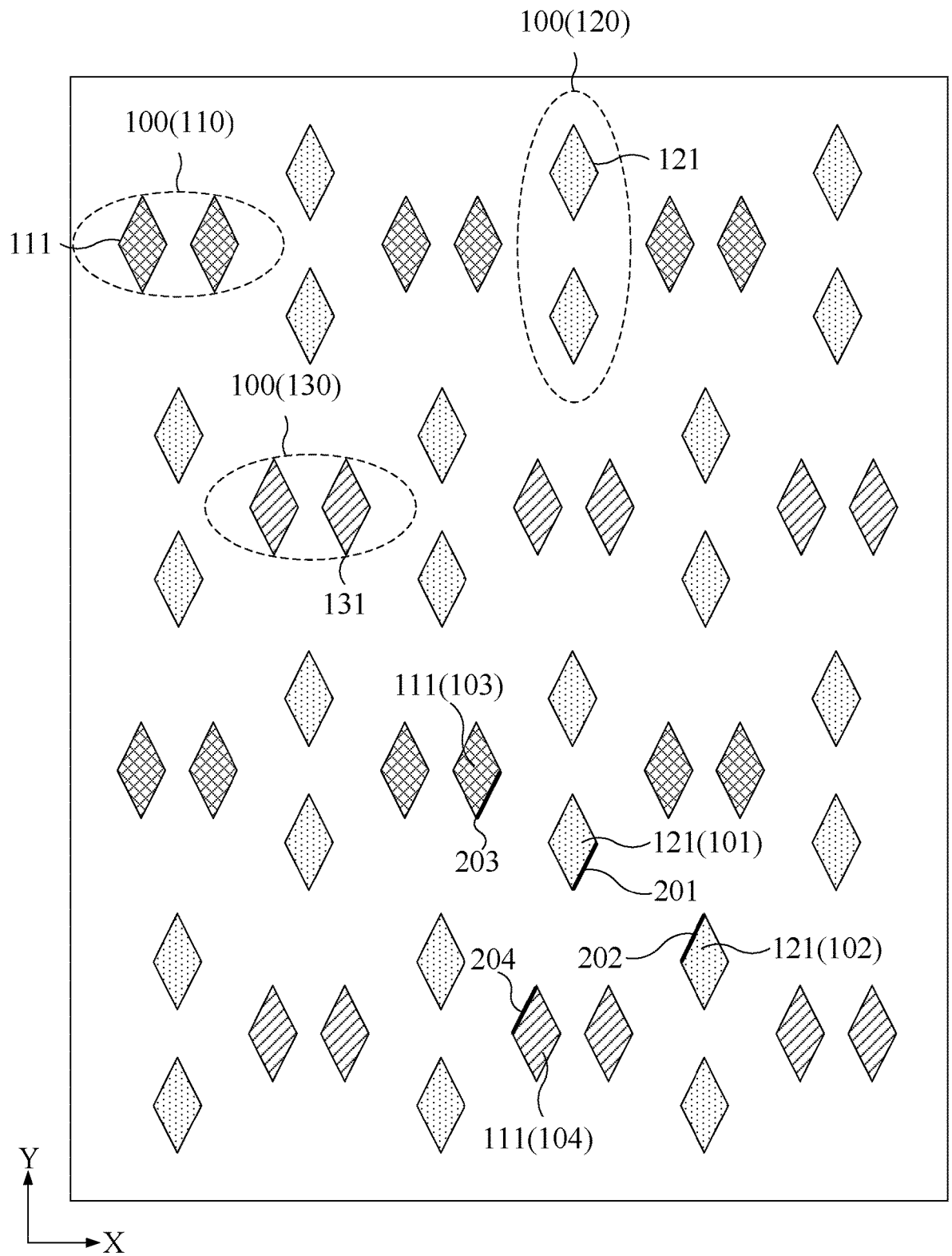
FIG. 9 illustrates another exemplary array substrate consistent with various disclosed embodiments of the present disclosure.

FIG. 9 illustrates another exemplary display panel consistent with various disclosed embodiments of the present disclosure. As shown in FIG. 9, opposing sides of two adjacent second sub-pixels 121 in two adjacent rows of sub-pixel groups may be arranged in parallel. The opposing sides of the first sub-pixel 111 and the adjacent third sub-pixel 131 in two adjacent rows of sub-pixel groups may be arranged in parallel.

For example, as shown in FIG. 9, the second sub-pixel 121 located below the second pixel group 120 at the third row and the fourth column may be referred to as a first second-sub-pixel 101. The second sub-pixel 121 above the second pixel group 120 at the fourth row and the fifth column may be referred to as a second second-sub-pixel 102. The first side 201 of the first second-sub-pixel 101 and the second side 202 of the second second-sub-pixel 102 may be opposing to each other and parallel to each.

The first sub-pixel 111 at the right of the first pixel group 110 at the third row and the third column may be referred to as a third first-sub-pixel 103. The third sub-pixel 131 at the left of the third pixel group 130 at the fourth row and the fourth column is may be referred to as a third third-sub-pixel 104. The third side 203 of the third first-sub-pixel 103 and the fourth side 204 of the third third-sub-pixel 104 may be opposing to each other and parallel to each other.

The two adjacent second sub-pixels 121 located in two adjacent rows of sub-pixel groups may be referred to as an "H"-th sub-pixel and an "I"-th sub-pixel, respectively. The first sub-pixel 111 and the adjacent third sub-pixel 131 located in two adjacent rows of sub-pixel groups may be referred to as a "J"-th sub-pixel and a "K"-th sub-pixel. The above-mentioned arrangement of opposing sides of the sub-pixels may be able to increase the first distance between the "H"-th sub-pixel and the "I"-th sub-pixel, and the second distance between the "J"-th sub-pixel and the "K"-th sub-pixel. The increase of the first distance may facilitate the increase of the bridge width between the adjacent openings of the mask corresponding to the second sub-pixel 112. Thus, the difficulty of forming the mask may be reduced. The increase of the second distance may reduce the probability of color mixing at the edges of light-emitting functional layers of the first sub-pixel 111 and the adjacent third sub-pixel 131 with different emission colors. Thus, the display effect of the display panel may be improved.

Figure 10:
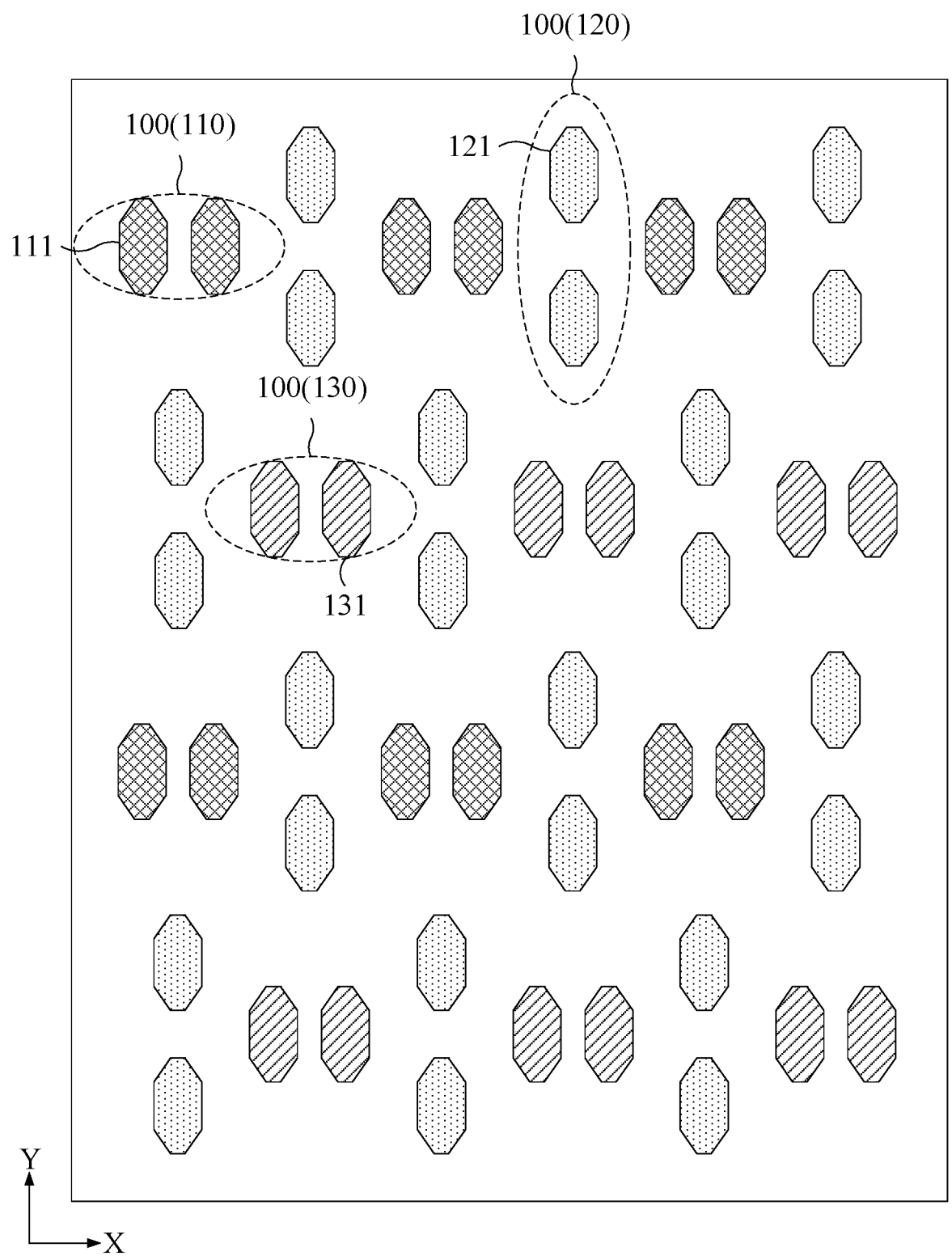
FIG. 10 illustrates another exemplary array substrate consistent with various disclosed embodiments of the present disclosure.

FIG. 10 illustrates another exemplary array substrate consistent with various disclosed embodiments of the present disclosure. As shown in FIG. 10, the shapes of the first sub-pixel 111, the second sub-pixel 121, and the third sub-pixel 131 may be octagonal. Based on the premise that the lengths of the sub-pixels along the X direction and the Y direction are certain constant values, and that the opposing sides of the "H"-th sub-pixel and the "I"-th sub-pixel are set in parallel, and the opposing sides of the "J"-th sub-pixel and the "K"-th sub-pixel are set in parallel, the aperture ratio of the octagonal sub-pixels may be increased compared to the sub-pixels of other shapes. Thus, the pixel aperture ratio of the display panel may be increased.

Figure 11:
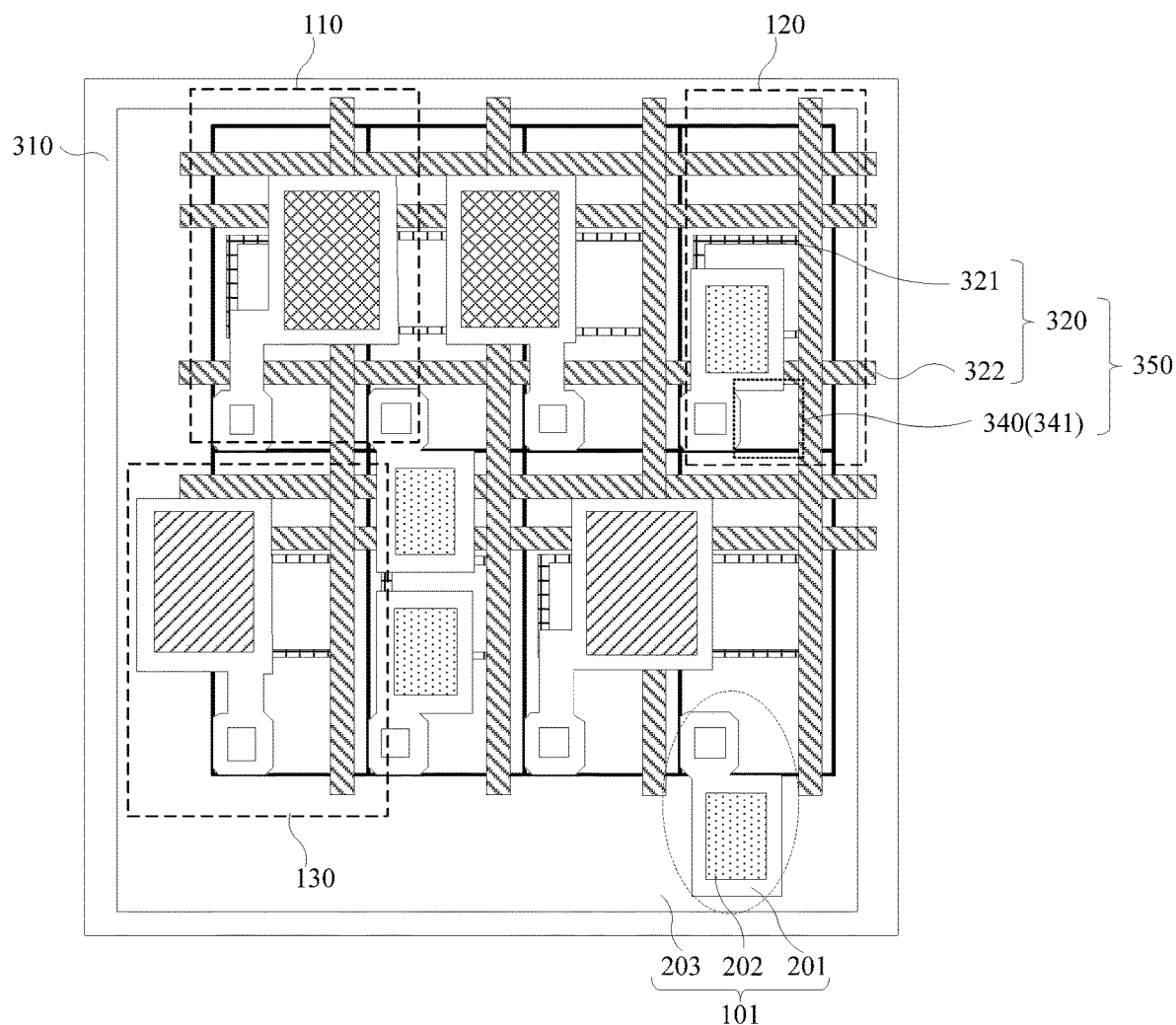
FIG. 11 illustrates an actual structure of an exemplary array substrate consistent with various disclosed embodiments of the present disclosure.

FIG. 11 illustrates an actual structure of an exemplary array substrate consistent with various disclosed embodiments of the present disclosure. As shown in FIG. 11, the light-emitting direction of the array substrate may be referred to as a third direction. The first sub-pixel 111, the second sub-pixel 121, and the third sub-pixel 131 each may include a base substrate 310, a pixel circuit layer 350 and a light-emitting component 101 that are sequentially stacked along the third direction. The pixel circuit layer 350 may include a pixel circuit 320 and a plurality of hollowed-out structures 340. Each hollowed-out structure 340 may penetrate the corresponding pixel circuit layer 320 along the third direction. The light-emitting component 101 may include a first electrode 201, an organic light-emitting functional layer 202 and a second electrode 203 that are sequentially stacked along the third direction. The first electrode 201 in the same sub-pixel may be electrically connected to the pixel circuit 320. The hollowed-out structure 340 having the largest area among the plurality of hollowed-out structures 340 may be referred to as the first hollowed-out structure 341. Along the third direction, the first electrode 201 and the organic light-emitting functional layer 202 in the same sub-pixel may not overlap with the first hollowed-out structure 341.

To simplify the structure of in the drawing, FIG. 11 only illustrates a portion of the pixel circuit 320 to describe the structure of the pixel circuit 320. The pixel circuit 320 may also include other conventional structures.

Compared with other hollowed-out structures, the first hollowed-out structure 341 may contribute more to the light transmittance of the display panel, and the first hollowed-out structure 341 may be the main light-transmitting area of the display panel. The configuration that the first electrode 201 and the organic light-emitting functional layer 202 in the same sub-pixel may not overlap with the first hollowed-out structure 341 may prevent the light-emitting component 101 from blocking the first hollowed-out structure 341. Thus, the effect to the light transmittance of the display panel may be avoided, and it may ensure that the display panel may have a substantially large light transmittance. Accordingly, the optical fingerprint recognition units of the display panel facing away from its light-emitting direction may receive a sufficient amount of light to obtain a better fingerprint recognition effect.

Further, referring to FIG. 11, the pixel circuit 320 may include a plurality of signal lines 322. Along the third direction, the overlapped region of the pixel circuit layer 320 and the first electrode 201 may be referred to as a first region, and the density of the signal lines 322 in the first region may be referred to as "h". In the region of the pixel circuit layer 320 except the first region, the density of the signal lines 322 in any region having the same area as the first region may be referred to as "k", and h>k.

Such a configuration may indicate that the first electrode 201 may be disposed in a region where the signal lines 322 have the highest density. The region having the highest density of the signal lines 322 may have the smallest light transmittance, and the light transmittance of the other regions may be greater than the light transmittance of such an area. Placing the first electrode 201 in such an area may make the first electrode 201 to have a substantially small influence on the light transmittance of the display panel. Thus, the optical fingerprint recognition units disposed on the pixel circuit layer 320 facing away from the light-emitting side of the display panel may receive a sufficient amount of light to obtain a better fingerprint recognition effect.

Figure 12:
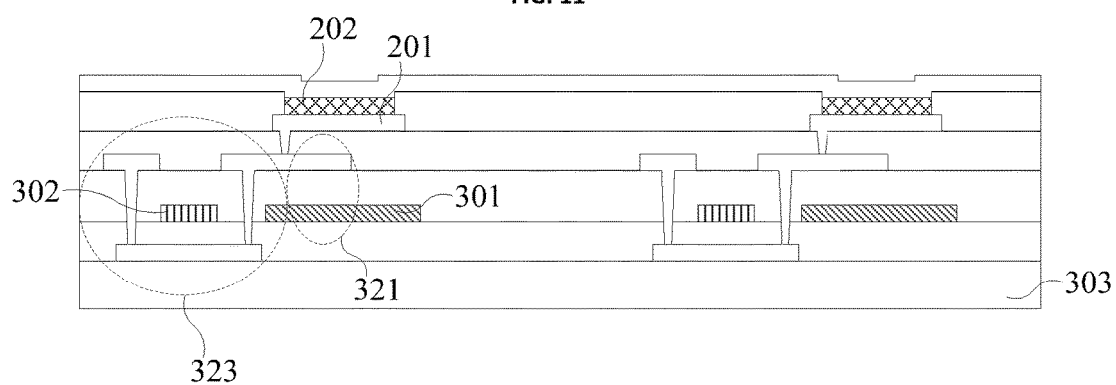
FIG. 12 illustrates a cross-sectional view of an exemplary array substrate consistent with various disclosed embodiments of the present disclosure.

FIG. 12 illustrates a cross-section of another exemplary array substrate consistent with various disclosed embodiments of the present disclosure. As shown in FIG. 12, the pixel circuit may include a storage capacitor 321 and a driving thin-film transistor 323. The driving thin-film transistor 323 may be electrically connected to the first electrode 201. The storage capacitor 321 may include a first capacitor electrode 301. The first capacitor electrode 301 and the gate electrode 302 of the driving thin-film transistor 323 may be disposed in a same layer. The orthographic projection of the first electrode 201 and the organic light-emitting functional layer 202 on the base substrate 303 may fall within the orthographic projection of the first capacitor electrode 301 on the base substrate 303.

FIG. 12 only illustrates the storage capacitor 321 and the driving thin-film transistor 323 in the pixel circuit. In addition to the storage capacitor 321 and the driving thin-film transistor 323, the pixel circuit may also include other components. The specific configuration of the pixel circuit may be referred to the conventional pixel circuit. The capacitor electrode of the storage capacitor 321 other than the first capacitor electrode 301 may not be limited to the structure illustrated in FIG. 12, it may be other structures.

The film layer where the first capacitor electrode 301 is located may be a metal layer and may belong to a light-shielding structure. The orthographic projection of the first electrode 201 and the organic light-emitting functional layer 202 on the substrate 303 may fall within the orthographic projection of the first capacitor electrode 301 on the substrate 303. Such a configuration may prevent the light-emitting component 101 from increasing the area of the light-shielding area. Thus, it may ensure the display panel to have a substantially large light transmittance, and the optical fingerprint recognition unit may receive a sufficient amount of light to obtain a better fingerprint recognition effect.

In one embodiment, the second sub-pixel 121 may be a green sub-pixel, and the first sub-pixel 111 and the third sub-pixel 131 may be any one of a red sub-pixel and a blue sub-pixel, and each of them may be different.

Red, green, and blue are the three primary colors of light. Red, green, and blue with different intensities may be mixed to obtain various colors of light. Therefore, the second sub-pixel 121 is set as the green sub-pixel, and the first sub-pixel 111 and the third sub-pixel 131 may be any one of a red sub-pixel and a blue sub-pixel, and may be different from each other. Such a configuration may make the display panel display to a variety of colors and may enrich the display colors of the display panel.

In addition, the human eyes may be more sensitive to green than red and blue. Thus, setting the color of a larger number of second sub-pixels 121 to be green may be able to increase the visual resolution of the display panel and improve the display effect of the display panel.

Figure 13:
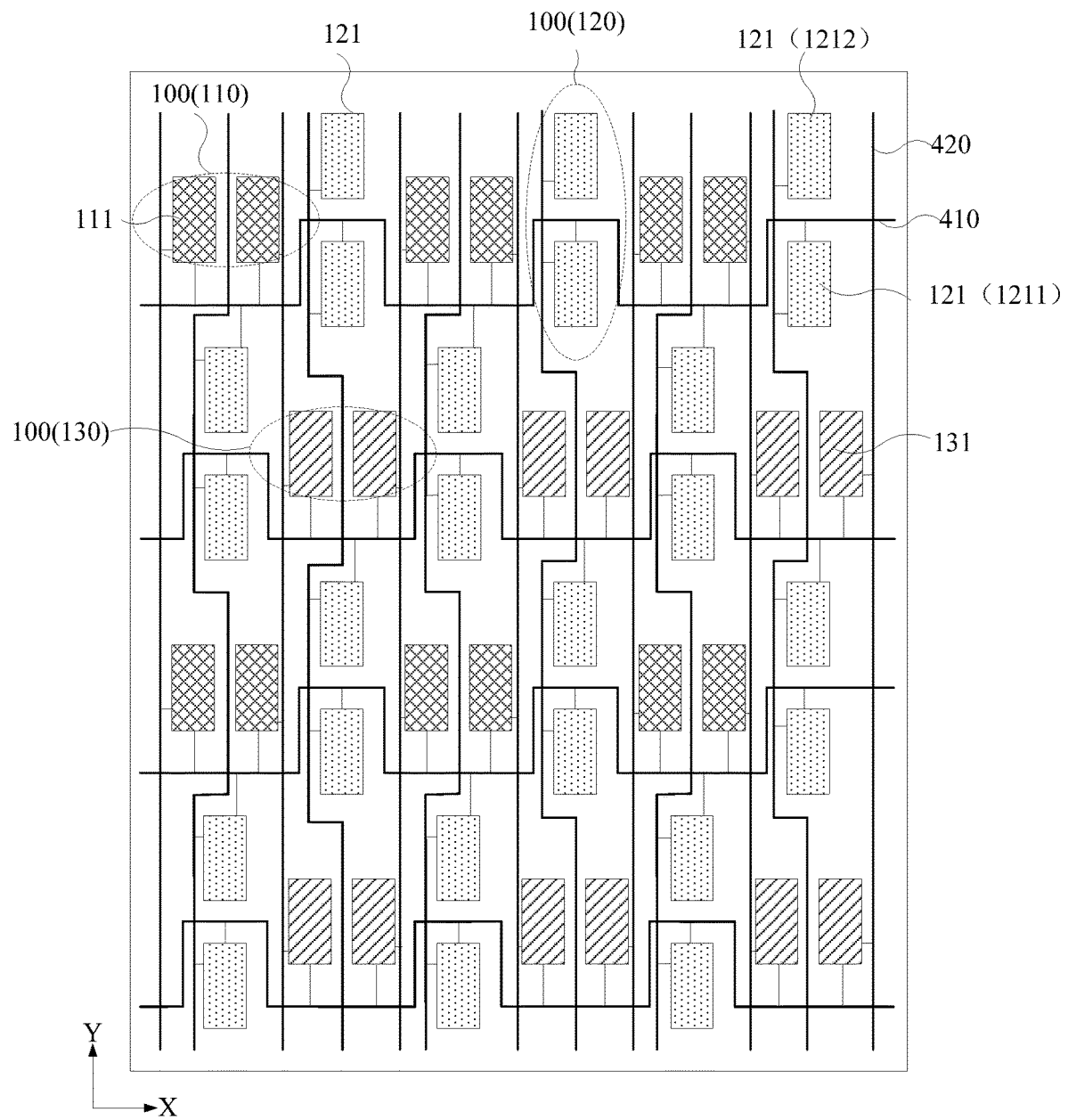
FIG. 13 illustrates another exemplary array substrate consistent with various disclosed embodiments of the present disclosure.

FIG. 13 illustrates another exemplary array substrate consistent with various disclosed embodiments of the present disclosure. As shown in FIG. 13, the second pixel group 120 may include a first second-sub-pixel 1211 and a second second-sub-pixel 1212. The first second-sub-pixels 1211 in each second pixel group 120 may be located at a first side of the second second-sub-pixel 1212. The plurality of first second-sub-pixels 1211, the plurality of first sub-pixels 111, or a plurality of third sub-pixels 131 in any row of pixel groups, and the plurality of second second-sub-pixels 1212 in an adjacent row of pixel group at the first side of the row of pixel groups may form a sub-pixel row. The plurality of first sub-pixels 111 arranged along the second direction Y may form a first sub-pixel column. The plurality of second sub-pixels 121 arranged along the second direction Y may form a second sub-pixel column. The plurality of third sub-pixels 131 arranged along the second direction Y may form a third sub-pixel column. The array substrate may further include a plurality of first scanning lines 410 and a plurality of data lines 420 intersecting with each other. A plurality of sub-pixels in the same sub-pixel row may be electrically connected to one scanning line 410. The plurality of second sub-pixels 121 in the same second sub-pixel column may be electrically connected to one data line 420. The sub-pixels in the adjacent first sub-pixel column and third sub-pixel column may be electrically connected to one data line 420.

For example, as shown in FIG. 13, the first side is the lower side. In particular, the first second sub-pixel 1211 of the second pixel group 120 may be located below the second second-sub-pixel 1212. A plurality of first second sub-pixels 1211 in the odd number rows of pixel groups, a plurality of second sub-pixels 121, and a plurality of second second sub-pixels 1212 in an adjacent row of pixel groups located below the odd number row of pixel groups may form a sub-pixel row. A plurality of first second sub-pixels 1211 in the even number rows of pixel groups, a plurality of third sub-pixels 131, and a plurality of second second sub-pixels 1212 in an adjacent row of pixel groups located below the even number row of pixel groups may form a sub-pixel column.

For illustrative purposes, in FIG. 13, the lower side is referred to as the first side. In some embodiments, the first side may also be the upper side.

In the connection manner of the scanning lines 410 and the data lines 420 in FIG. 13, the distance between the scanning line 410 and the data line 420 and the corresponding sub-pixel may be relatively short. Such a configuration may facilitate the electrical connection between the scanning line 410 and the data line 420 and the corresponding sub-pixel. Further, the length of the connection line may be relatively short, the difficulty of routing may be reduced. In addition, the scan lines 410 and the data lines 420 may be more regularly routed in the gaps among the sub-pixels. Thus, the design may be simple, and the process may be easy.

Further, referring to FIG. 1, the two second sub-pixels 121 in any second pixel group 120 and the sub-pixels disposed on two opposing sides of the second pixel group 120 respectively may form pixel units 140. In the display stage, the pixel unit 140 may borrow a sub-pixel of a third color from its adjacently disposed pixel unit 140 to form a display pixel unit 150. The display pixel unit 150 may be used to display the screen content of an image pixel unit in a to-be-displayed image. The light-emission color of the sub-pixel of the third color may be different from the light-emission color of two sub-pixels in the pixel unit 140 sharing the sub-pixels.

For example, as shown in FIG. 1, the plurality of pixel units 140 may include a first pixel unit 141, a second pixel unit 142, a third pixel unit 143, and a fourth pixel unit 144. In the display stage, the first pixel unit 141 may borrow the sub-pixel of third color from the fourth pixel unit 144 disposed adjacently to form a first display pixel unit 151. In particular, the first pixel unit 141 may include a first sub-pixel 111 and a second sub-pixel 121, and the sub-pixel of third color may be the third sub-pixel 131 in the fourth pixel unit 144. Similarly, the second pixel unit 142 may borrow a sub-pixel of third color from the adjacent third pixel unit 143 to form a second display pixel unit 152. In particular, the second pixel unit 142 may include a first sub-pixel 111 and a second sub-pixel 121, and the sub-pixel of third-color may be the third sub-pixel 131 in the third pixel unit 143.

Each pixel unit 140 may borrow the sub-pixel of third color in any of its adjacent pixel units 140 to form the display pixel unit 150. For illustrative purposes, FIG. 13 illustrates the pixel unit 140 having the borrowed sub-pixel to be adjacent the original pixel, and the position relationship between the pixel unit having the borrowed sub-pixel and the original pixel is not limited by the present disclosure.

The image pixel unit may include three sub-pixels with the same emission color as the first sub-pixel 111, the second sub-pixel 121, and the third sub-pixel 131, respectively. The to-be displayed image may include a positive integer number of image pixel units. When the pixel array provided in the present disclosure is used to display the to-be-displayed image, the total number of image pixel units in the to-be-displayed image may be equal to the total number of pixel units 140 in the pixel array provided in the present disclosure. Further, as shown in FIG. 1, each pixel unit 140 may borrow a sub-pixel of third color from an adjacent pixel unit 140 to from a display pixel unit 150. Therefore, the total number of the display pixel unit 150 corresponding to the pixel array provided in the present disclosure may be equal to the total number of pixel units 140, and then may be equal to the total number of image pixel units in the to-be-display image. Further, the disposition manner of the display pixel units 150 and the disposition manner of the sub-pixels in the image pixel units may be same. Thus, each display pixel unit 150 may be used to display the content of each image pixel unit to realize the display of the to-be-displayed image.

The pixel rendering method provided in the present disclosure may enable a display panel with a lower physical pixel density to achieve a higher display pixel density. Thus, the display effect of the display panel may be improved.

Figure 14:
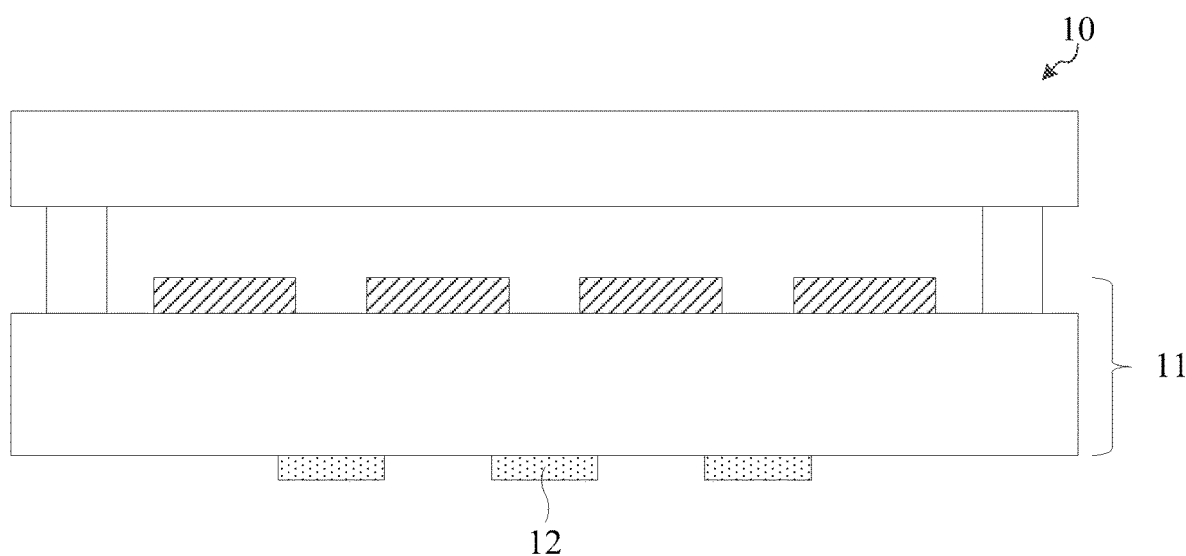
FIG. 14 illustrates an exemplary display panel consistent with various disclosed embodiments of the present disclosure.

FIG. 14 illustrates an exemplary a display panel consistent with various disclosed embodiments of the present disclosure. As shown in FIG. 14, the display panel 10 may include an array substrate 11. The array substrate 11 may be a disclosed array substrate, or other appropriate array substrate. Because the display panel 10 may include any array substrate 11 provided by the present disclosure, the display panel may have same or corresponding beneficial effects as the disclosed array substrate.

Further, referring to FIG. 14, the display panel may further include a plurality of optical fingerprint recognition units 12. The plurality of optical fingerprint recognition units 12 may be disposed on a side of the array substrate 11 facing away from its light-emitting surface.

Figure 15:
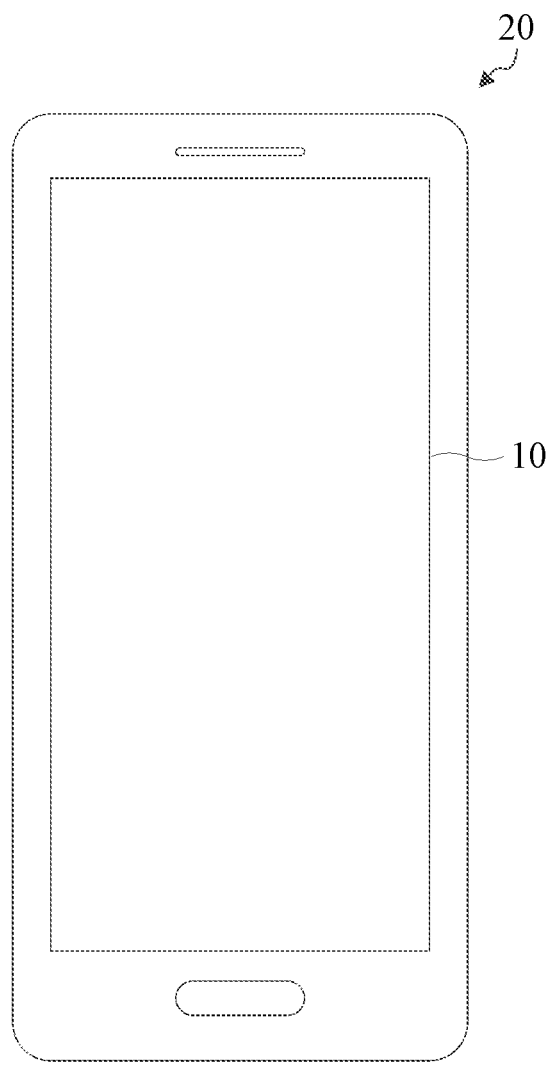
FIG. 15 illustrates an exemplary display device consistent with various disclosed embodiments of the present disclosure.

FIG. 15 illustrates an exemplary display device consistent with various disclosed embodiments of the present disclosure. As shown in FIG. 15, the display device 20 may include a display panel 10. The display panel 10 may be a disclosed display panel, or other appropriate display panel. Because the display device 20 may include a disclosed display panel, the display device 20 may have same or corresponding beneficial effects as the disclosed display panel and the disclosed array substrate.

In the technical solutions provided by the present disclosure, in the odd number rows of pixel groups and the odd number columns of pixel groups, the first pixel groups and the second pixel groups may be alternately arranged; and in the even number rows of pixel groups and the even number columns of pixel groups, the second pixel groups and the third pixel groups may be arranged alternately. The first pixel group may include two first sub-pixels arranged along the first direction. The second pixel group may include two second sub-pixels arranged along the second direction. The third pixel group may include two third sub-pixels arranged along the first direction. Along the second direction, the second pixel group having a greater length in any row of pixel groups may be disposed to correspond to the first pixel group or the three-pixel group having a smaller length in the adjacent rows of pixel groups. The adjacent rows of pixel groups may be mosaicked. Thus, the area of other regions outside the sub-pixel opening regions in the array substrate may be reduced, and the pixel aperture ratio of the display panel may be increased. In addition, the sub-pixels of the same-color may be arranged along oblique lines, and stepped surfaces may not be formed. Thus, the aliasing phenomenon of the display screen may be avoided; and the display effect of the display panel may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An array substrate, comprising:
   a plurality of pixel groups arranged as a matrix with a row direction as a first direction and a column direction as a second direction,
   wherein:
   the plurality of pixel groups include a plurality of first pixel groups, a plurality of second pixel groups and a plurality of third pixel groups;
   in odd number rows of the matrix of pixel groups and odd number columns of the matrix of pixel groups, the plurality of first pixel groups and the plurality of second pixel groups are alternately arranged;
   in even number rows of the matrix of pixel groups and even number columns of the matrix of pixel groups, the plurality of second pixel groups and the plurality of third pixel groups are alternately arranged;
   a first pixel group of the plurality of first pixel groups includes two first sub-pixels arranged along the first direction;
   a second pixel group of the plurality of second pixel groups includes two second sub-pixels arranged along the second direction; and
   a third pixel group of the plurality of third pixel groups includes two third sub-pixel groups arranged along the first direction.

2. The array substrate according to claim 1, wherein:
   each of the two first sub-pixels, the two second sub-pixels and the two third sub-pixels includes a light-emitting component;
   the light-emitting component includes a first electrode, an organic light-emitting functional layer and a second electrode sequentially stacked along a light-emitting direction; and
   at least one pixel group in the plurality of first pixel groups, the plurality of second pixel groups and the plurality of third pixel groups is a reference pixel group,
   wherein organic light-emitting functional layers of two sub-pixels in the reference pixel group share a same mask opening.

3. The array substrate according to claim 1, wherein:
   along the first direction, a distance between two sub-pixels in a same pixel group is "a", a distance between two adjacent pixel groups is "b", and a<b; and
   along the second direction, a distance between two sub-pixels in a same pixel group is "c", a distance between two adjacent pixel groups is "d", and c<d.

4. The array substrate according to claim 3, wherein:
   a value of "a" is in a range of approximately 8 μm-13 μm;
   a value of "c" is in a range of approximately 8 μm-13 μm;
   a value of "b" is in a range of approximately 14 μm-28 μm; and
   a value of "d" is in a range of approximately 14 μm-28 μm.

5. The array substrate according to claim 1, wherein:
   a pixel group at an n-th row and an m-th column and a pixel group at an (n+1)-th row and an (m+1)-th column are located in a same straight line; and
   an acute angle between the straight line and the first direction is in a range of approximately 30°-70°,
   wherein:
   "n" traverses all positive integers smaller than a total row number of the matrix; and
   "m" traverses all positive integers smaller than a total column number of the matrix.

6. The array substrate according to claim 1, wherein:
   opposing sides of the two adjacent second sub-pixels that are respectively located in two adjacent pixel group rows are parallel to each other; and
   opposing sides of a first sub-pixel and an adjacent third sub-pixel that are respectively located in two adjacent pixel group rows are parallel to each other.

7. The array substrate according to claim 6, wherein:
   the first sub-pixels, the second sub-pixels and the third sub-pixels are octagonal-shaped.

8. The array substrate according to claim 1, wherein:
   a light-emitting direction of the array substrate is a third direction;
   each of the first sub-pixels, the second sub-pixels and the third sub-pixels includes a base substrate, a pixel circuit layer and a light-emitting component sequentially stacked along the third direction;
   the pixel circuit layer includes a pixel circuit and a plurality of hollowed-out structures;
   along the third direction, the plurality of hollowed-out structures penetrate the corresponding pixel circuit layer;
   the light-emitting component includes a first electrode, an organic light-emitting functional layer and a second electrode sequentially stacked along the third direction;
   in a same sub-pixel, the first electrode is electrically connected to the pixel circuit;
   the plurality of hollowed-out structures includes a first hollowed-out structure having a largest area among the plurality of hollowed-out structures; and
   along the third direction, the first electrode and the light-emitting functional layer in a same sub-pixel does not overlap with the first hollowed-out structure.

9. The array substrate according to claim 8, wherein:
   the pixel circuit includes a plurality of signal lines;
   along the third direction, an overlapped region between the pixel circuit layer and the first electrode is a first region;
   a signal line density in the first region is "h";

in the pixel circuit layer outside the first region, a signal line density of any region having a same area as an area of the first region is "k"; and h>k.

10. The array substrate according to claim 8, wherein:

the pixel circuit includes a storage capacitor and a driving thin-film transistor;

the driving thin-film transistor is electrically connected to the first electrode;

the storage capacitor includes a first capacitor electrode;

the first capacitor electrode and a gate electrode of the driving thin-film transistor are disposed on a same layer; and an orthographic projection of the first electrode on the base substrate and an orthographic projection of the organic light-emitting functional layer on the base substrate fall within an orthographic projection of the first capacitor electrode on the base substrate.

11. The array substrate according to claim 1, wherein:

the second sub-pixels are green pixels;

the first sub-pixels and the third sub-pixels are any one of red pixels and blue pixels; and a color of the first sub-pixels is different from a color of the third sub-pixels.

12. The array substrate according to claim 1, wherein:

the second pixel group includes a first second-sub-pixel and a second second-sub-pixel;

each second second-sub-pixel in the plurality of second pixel groups is located at a first side of each first second-sub-pixels;

a plurality of first second-sub-pixels, the plurality of first sub-pixels or the plurality of third sub-pixels in any pixel group row and a plurality of second second-sub-pixels in a pixel group row adjacent to the first side of the any pixel group row form a first sub-pixel column;

a plurality of first sub-pixels arranged along the second direction form a first sub-pixel column;

a plurality of second sub-pixels arranged along the second direction form a second sub-pixel column;

a plurality of third sub-pixels arranged along the second direction form a third sub-pixel column;

the array substrate further includes a plurality of first scan lines and a plurality of data lines intersecting with each other;

a plurality of sub-pixels in a same sub-pixel row are electrically connected to one of the plurality of scan lines;

a plurality of second sub-pixels in a same second sub-pixel column are electrically connected to one of the plurality of data lines; and adjacent sub-pixels in the first sub-pixel column and the third sub-pixel column are electrically connected to one of the plurality of data lines.

13. The array substrate according to claim 1, wherein:

two sub-pixels in any group of the plurality of second pixel groups and sub-pixels respectively disposed adjacent to opposing sides the any group of the plurality of second pixel groups form a pixel unit;

during a display stage, the pixel unit borrows a sub-pixel of a third color in an adjacent pixel unit to form a display pixel unit; and the display pixel unit is configured to display content of an image pixel unit in a to-be-displayed image, wherein:

a light-emitting color of the sub-pixel of the third color is different from a light-emitting color of the two sub-pixels of the pixel unit borrowing the sub-pixel.

14. A display panel, comprising:

an array substrate, including:

a plurality of pixel groups arranged as a matrix with a row direction as a first direction and a column direction as a second direction, wherein:

the plurality of pixel groups include a plurality of first pixel groups, a plurality of second pixel groups and a plurality of third pixel groups;

in odd number rows of the matrix of pixel groups and odd number columns of the matrix of pixel groups, the plurality of first pixel groups and the plurality of second pixel groups are alternately arranged;

in even number rows of the matrix of pixel groups and even number columns of the matrix of pixel groups, the plurality of second pixel groups and the plurality of third pixel groups are alternately arranged;

a first pixel group of the plurality of first pixel groups includes two first sub-pixels arranged along the first direction;

a second pixel group of the plurality of second pixel groups includes two second sub-pixels arranged along the second direction; and a third pixel group of the plurality of third pixel groups includes two third sub-pixel groups arranged along the first direction.

15. The display panel according to claim 14, further comprising:

a plurality of optical fingerprint identification units disposed on a side of the array substrate facing away from a light-emitting side of the array substrate.

16. The display panel according to claim 14, wherein:

each of the two first sub-pixels, the two second sub-pixels and the two third sub-pixels includes a light-emitting component;

the light-emitting component includes a first electrode, an organic light-emitting functional layer and a second electrode sequentially stacked along a light-emitting direction; and at least one pixel group in the plurality of first pixel groups, the plurality of second pixel groups and the plurality of third pixel groups is a reference pixel group, wherein organic light-emitting functional layers of the two sub-pixels in the reference pixel group borrow a same mask opening.

17. The display panel according to claim 14, wherein:

along the first direction, a distance between two sub-pixels in a same pixel group is "a", a distance between two adjacent pixel groups is "b", and a<b; and along the second direction, a distance between two sub-pixels in a same pixel group is "c", a distance between two adjacent pixel groups is "d", and c<d.

18. A display device, comprising:

a display panel, wherein:

the display panel includes an array substrate; and the array substrate includes a plurality of pixel groups arranged as a matrix with a row direction as a first direction and a column direction as a second direction, wherein:

the plurality of pixel groups include a plurality of first pixel groups, a plurality of second pixel groups and a plurality of third pixel groups;

in odd number rows of the matrix of pixel groups and odd number columns of the matrix of pixel groups, the plurality of first pixel groups and the plurality of second pixel groups are alternately arranged;

in even number rows of the matrix of pixel groups and even number columns of the matrix of pixel groups, the plurality of second pixel groups and the plurality of third pixel groups are alternately arranged;

a first pixel group of the plurality of first pixel groups includes two first sub-pixels arranged along the first direction;

a second pixel group of the plurality of second pixel groups includes two second sub-pixels arranged along the second direction; and a third pixel group of the plurality of second pixel groups includes two third sub-pixel groups arranged along the first direction.

19. The display device according to claim 18, wherein the display panel further comprises:

a plurality of optical fingerprint identification units disposed on a side of the array substrate facing away from a light-emitting side of the array substrate.

20. The display device according to claim 18, wherein:

each of the two first sub-pixels, the two second sub-pixels and the two third sub-pixels includes a light-emitting component;

the light-emitting component includes a first electrode, an organic light-emitting functional layer and a second electrode sequentially stacked along a light-emitting direction; and at least one pixel group in the plurality of first pixel groups, the plurality of second pixel groups and the plurality of third groups is a reference pixel group, wherein organic light-emitting functional layers of the two sub-pixels in the reference pixel group share a same mask opening.

* * * * *